(12) United States Patent
Huang et al.

(10) Patent No.: US 8,778,767 B2
(45) Date of Patent: Jul. 15, 2014

(54) INTEGRATED CIRCUITS AND FABRICATION METHODS THEREOF

(75) Inventors: Shih-Hsien Huang, Renwu Township (TW); Yi-Fang Pai, Hsinchu (TW); Chien-Chang Su, Kaohsiung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/029,378

(22) Filed: Feb. 17, 2011

(65) Prior Publication Data

US 2012/0126296 A1   May 24, 2012

Related U.S. Application Data

(60) Provisional application No. 61/414,946, filed on Nov. 18, 2010.

(51) Int. Cl.
*H01L 21/20* (2006.01)
*H01L 21/02* (2006.01)
*H01L 29/78* (2006.01)

(52) U.S. Cl.
CPC ....... *H01L 21/02636* (2013.01); *H01L 29/7848* (2013.01)
USPC .......................................................... 438/300

(58) Field of Classification Search
CPC .................. H01L 21/02518; H01L 21/02636; H01L 29/7848; H01L 29/7842
USPC ........ 438/300, 589, 595; 257/E21.001, E21.4
See application file for complete search history.

(56) References Cited

U.S. PATENT DOCUMENTS

| | | | | | |
|---|---|---|---|---|---|
| 4,701,423 | A | * | 10/1987 | Szluk | 438/231 |
| 5,710,450 | A | * | 1/1998 | Chau et al. | 257/344 |
| 5,908,313 | A | * | 6/1999 | Chau et al. | 438/299 |
| 6,137,149 | A | * | 10/2000 | Kodama | 257/408 |
| 6,204,233 | B1 | * | 3/2001 | Smith et al. | 510/283 |
| 6,232,641 | B1 | * | 5/2001 | Miyano et al. | 257/382 |
| 6,238,989 | B1 | * | 5/2001 | Wc Huang et al. | 438/305 |
| 6,274,894 | B1 | * | 8/2001 | Wieczorek et al. | 257/192 |
| 6,368,927 | B1 | * | 4/2002 | Lee | 438/300 |
| 7,195,985 | B2 | * | 3/2007 | Murthy et al. | 438/341 |
| 7,652,328 | B2 | * | 1/2010 | Yamasaki et al. | 257/330 |
| 7,772,097 | B2 | * | 8/2010 | Tomasini et al. | 438/505 |
| 7,816,217 | B2 | * | 10/2010 | Lin et al. | 438/300 |
| 7,910,445 | B2 | * | 3/2011 | Onoda | 438/285 |
| 7,928,427 | B1 | * | 4/2011 | Chang | 257/24 |
| 8,012,840 | B2 | * | 9/2011 | Ando | 438/300 |
| 8,053,273 | B2 | * | 11/2011 | Kammler et al. | 438/99 |
| 8,207,523 | B2 | * | 6/2012 | Tsai et al. | 257/19 |

(Continued)

OTHER PUBLICATIONS

Fischer, P. R., et al., "Low Temperature Silcore Deposition of Undoped and Doped Silicon Films", ECS Transactions, 3(2) 203-215 (2006), pp. 203-215.

*Primary Examiner* — Michele Fan
(74) *Attorney, Agent, or Firm* — Lowe Hauptman & Ham, LLP

(57) ABSTRACT

A method of forming an integrated circuit includes forming a gate structure over a substrate. Portions of the substrate are removed to form recesses adjacent to the gate structure. A silicon-containing material structure is formed in each of the recesses. The silicon-containing material structure has a first region and a second region, the second region is closer to the gate structure than the first region, and the first region is thicker than the second region.

20 Claims, 9 Drawing Sheets

(56) References Cited

U.S. PATENT DOCUMENTS

| | | | |
|---|---|---|---|
| 2001/0023108 A1* | 9/2001 | Miyano et al. | 438/300 |
| 2003/0148563 A1* | 8/2003 | Nishiyama | 438/197 |
| 2005/0035408 A1* | 2/2005 | Wang et al. | 257/344 |
| 2005/0077570 A1* | 4/2005 | Nishinohara | 257/336 |
| 2005/0095799 A1* | 5/2005 | Wang et al. | 438/303 |
| 2005/0158931 A1* | 7/2005 | Chen et al. | 438/191 |
| 2006/0084235 A1* | 4/2006 | Barr et al. | 438/300 |
| 2006/0088968 A1* | 4/2006 | Shin et al. | 438/299 |
| 2006/0115933 A1* | 6/2006 | Ye et al. | 438/139 |
| 2006/0131665 A1* | 6/2006 | Murthy et al. | 257/384 |
| 2006/0148151 A1* | 7/2006 | Murthy et al. | 438/197 |
| 2006/0166414 A1* | 7/2006 | Carlson et al. | 438/149 |
| 2006/0228842 A1* | 10/2006 | Zhang et al. | 438/184 |
| 2006/0234504 A1 | 10/2006 | Bauer et al. | |
| 2006/0289902 A1* | 12/2006 | Ping et al. | 257/278 |
| 2007/0096194 A1* | 5/2007 | Streck et al. | 257/315 |
| 2007/0148919 A1* | 6/2007 | Lin et al. | 438/478 |
| 2007/0200176 A1* | 8/2007 | Kammler et al. | 257/347 |
| 2007/0287272 A1* | 12/2007 | Bauer et al. | 438/485 |
| 2008/0085577 A1* | 4/2008 | Shih et al. | 438/199 |
| 2008/0157091 A1* | 7/2008 | Shin et al. | 257/66 |
| 2008/0224212 A1* | 9/2008 | Lee et al. | 257/344 |
| 2009/0020820 A1* | 1/2009 | Baik et al. | 257/369 |
| 2009/0075029 A1* | 3/2009 | Thomas et al. | 428/173 |
| 2009/0085125 A1* | 4/2009 | Kim et al. | 257/369 |
| 2009/0236633 A1* | 9/2009 | Chuang et al. | 257/190 |
| 2009/0267118 A1* | 10/2009 | Chakravarti et al. | 257/288 |
| 2010/0025779 A1* | 2/2010 | Kammler et al. | 257/408 |
| 2010/0193882 A1* | 8/2010 | Hoentschel et al. | 257/410 |
| 2010/0219475 A1* | 9/2010 | Kronholz et al. | 257/351 |
| 2010/0221883 A1* | 9/2010 | Kronholz et al. | 438/285 |
| 2010/0244107 A1* | 9/2010 | Kronholz et al. | 257/288 |
| 2011/0117732 A1* | 5/2011 | Bauer et al. | 438/507 |
| 2011/0124169 A1* | 5/2011 | Ye et al. | 438/299 |
| 2011/0147828 A1* | 6/2011 | Murthy et al. | 257/327 |
| 2012/0032275 A1* | 2/2012 | Haran et al. | 257/401 |
| 2012/0104498 A1* | 5/2012 | Majumdar et al. | 257/351 |

* cited by examiner

INTEGRATED CIRCUITS AND FABRICATION METHODS THEREOF

CROSS-REFERENCES TO RELATED APPLICATIONS

The present application claims priority of U.S. Provisional Patent Application Ser. No. 61/414,946, entitled "INTEGRATED CIRCUITS AND FABRICATION METHODS THEREOF" filed on Nov. 18, 2010, which is incorporated herein by reference in its entirety.

The present application is related to U.S. application Ser. No. 12/886,743, entitled "METHODS OF FORMING INTEGRATED CIRCUITS" filed on Sep. 21, 2010, which is incorporated herein by reference.

TECHNICAL FIELD

The present disclosure relates generally to the field of semiconductor devices, and more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
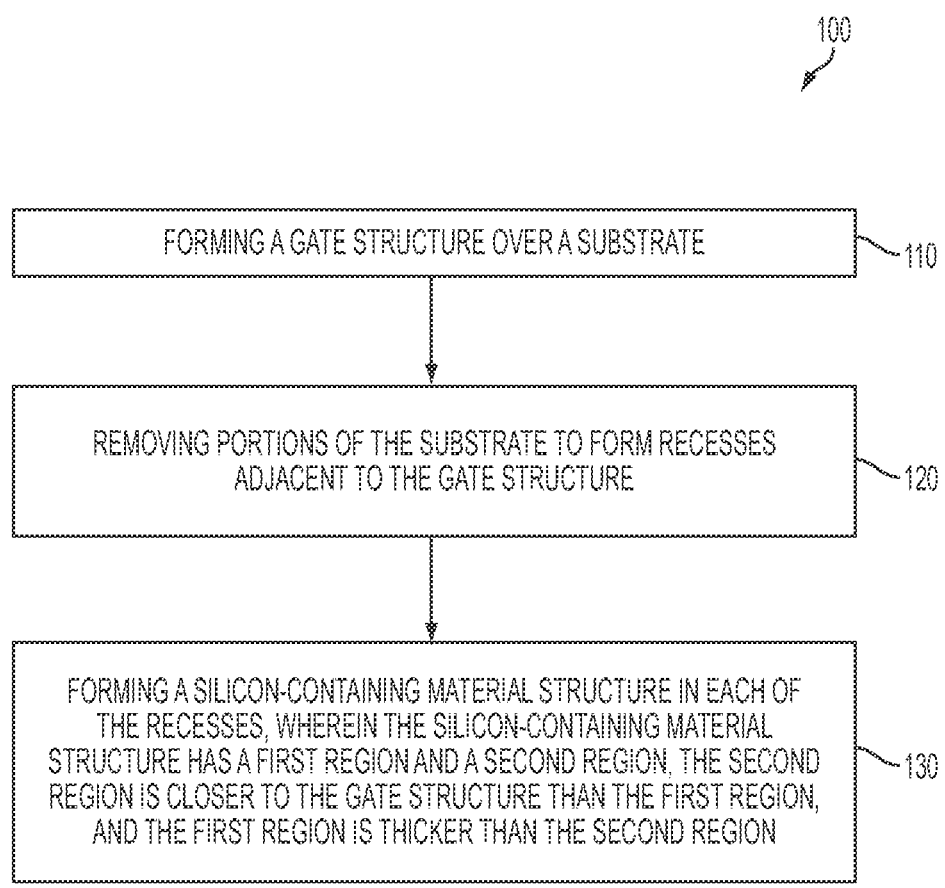
FIG. 1 is a flowchart illustrating an exemplary method of forming an integrated circuit.

Generally, a plurality of ion implantations have been implemented for forming source/drain (S/D) regions, lightly-doped drain (LDD) regions, and pocket regions of transistors. For example, an N-type source/drain (NSD) process has a room-temperature phosphorus ion implantation that is provided to form a gradient dopant junction profile in a substrate. A room-temperature carbon ion implantation is then performed to the S/D regions to prevent over diffusion of phosphorus dopants into the substrate. A room-temperature arsenic ion implantation and a room-temperature phosphorus ion implantation are performed to form S/D doped regions. After the multiple ion implantations, a rapid thermal anneal (RTA) is performed to activate dopants and to cure damage resulting from the ion implantations. Silicde is then formed at the top of the S/D doped regions.

As noted, the process described above uses the room-temperature phosphorus ion implantation to form the junction profile. When the size of transistors are scaled down, the S/D junction profile may be too deep. The multiple ion implantations may also substantially damage the S/D regions. To cure the damage, a high thermal budget, e.g., a higher RTA temperature of about 1050° C. and/or a longer RTA time, may be applied. The high thermal budget may aggravate a short-channel effect (SCE) of the transistors. If a low thermal budget is applied, implantation damage may not be desirably cured. The low thermal budget may also result in a transient-enhanced diffusion (TED).

In other approaches for forming S/D regions of transistors, a selective-epitaxial-growth (SEG) process has been proposed. For forming the S/D regions, the substrate near the gate electrodes is recessed. The SEG process epitaxially grows a single silicon layer in the recessed substrate. It is found that, due to a process loading effect, the epitaxially-grown silicon layers grown in the core region and the input/output (I/O) region of the chip have different thicknesses. The thickness variation at the center and peripheral areas may be about 3 nanometer (nm) or more. In a worst-case scenario, the thickness variation may reach about 5 nm. If the thickness variation is large, a subsequent process, e.g. an etching process, to form contact holes exposing the S/D regions may overetch and/or underetch the epitaxially-grown silicon layers. The overetched and/or underetched silicon layers in the S/D regions located in different regions of the chip may affect electrical characteristics of transistors, e.g., resistances, currents, etc.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Illustrated in FIG. 1 is a flowchart of an exemplary method of forming an integrated circuit. FIGS. 2A-2H are schematic cross-sectional views of an integrated circuit during various fabrication stages. The integrated circuit may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors. It is understood that FIGS. 2A-2H have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can also include forming a silicon-containing material structure in each of the recesses. The silicon-containing material structure has a first region and a second region. The second region is closer to the gate structure than the first region. The first region is thicker than the second region (block 130).

Figure 2A:
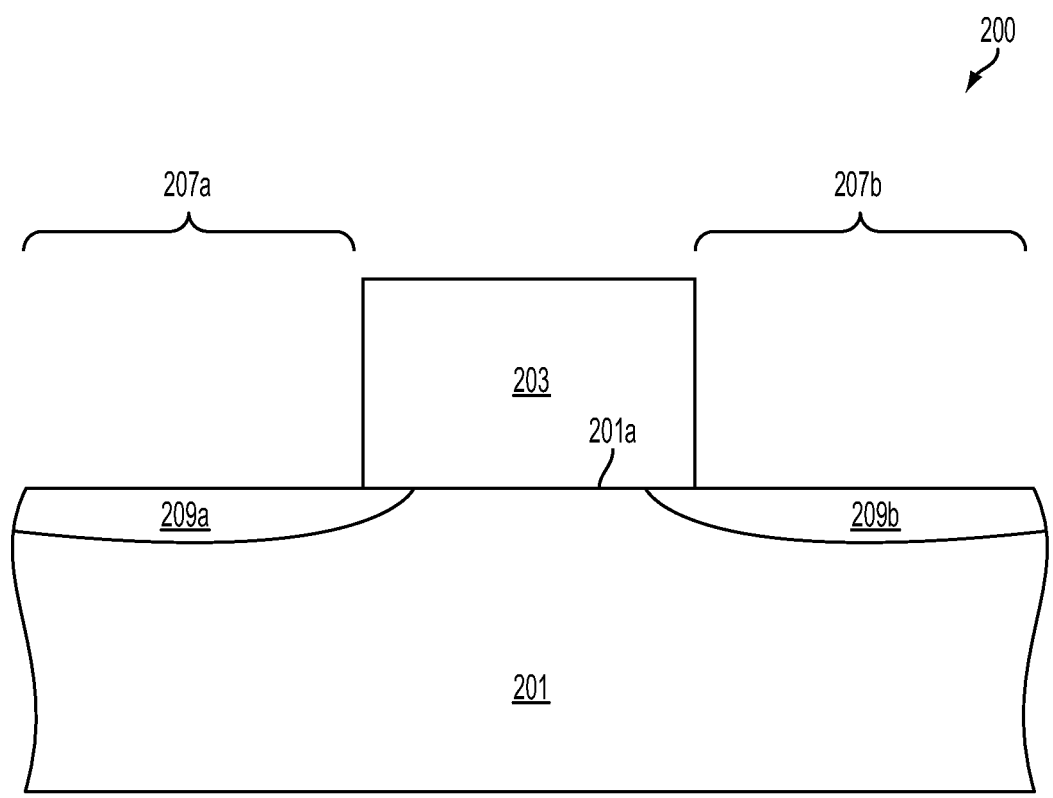
FIGS. 2A-2H are schematic cross-sectional views of an integrated circuit during various fabrication stages.

Referring now to FIGS. 2A-2H in conjunction with FIG. 1, an integrated circuit 200 can be fabricated in accordance with the method 100 of FIG. 1. In FIG. 2A, the integrated circuit 200 can have a substrate 201. In some embodiments forming N-type transistors, the substrate 201 can be a silicon substrate doped with a P-type dopant, such as boron (resulting in a P-type substrate). In other embodiments, the substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Referring again to FIG. 2A, a gate structure 203 can be formed over a surface 201a of the substrate 201. In some embodiments forming an N-type transistor, the integrated circuit 200 can include source/drain (S/D) regions, e.g., S/D regions 207a and 207b, adjacent to sidewalls of the gate structure 203. In some embodiments, the gate structure 203 can be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments forming an N-type transistor, N-type lightly-doped drains (LDDs) 209a and 209b can be formed in the substrate 201. Portions of the N-type LDDs 209a and 209b can be formed under the gate structure 203. The N-type LDDs 209a and 209b can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the N-type LDDs 209a and 209b. In other embodiments forming an N-type transistor, P-type pocket doped regions (not shown) can be formed in the substrate 201. The P-type pocket doped regions can be formed of P-type dopants (impurities). For example, the dopants can comprise boron and/or other group III elements.

Figure 2B:
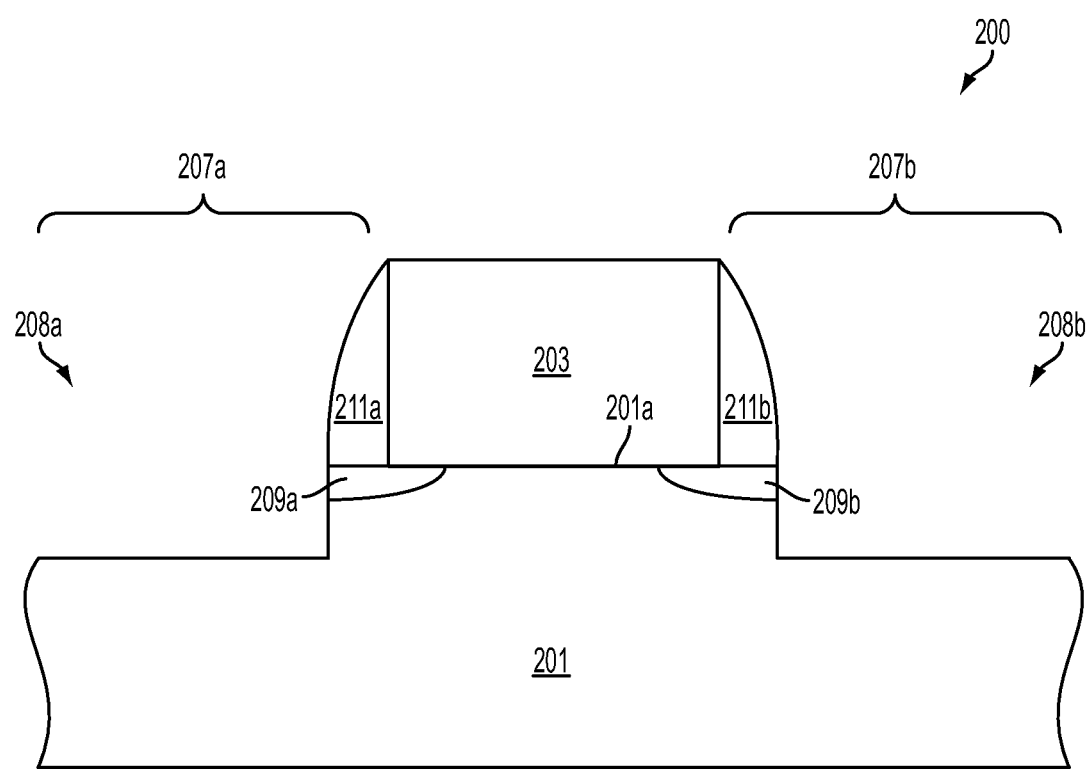

Referring to FIGS. 1 and 2B, the method 100 can include removing portions of the substrate to form recesses adjacent to the gate structure (block 120). For example, recesses 208a and 208b are formed in the substrate 201 and adjacent to the gate structure 203 as shown in FIG. 2B. In some embodiments, spacers 211a and 211b can be formed on the sidewalls of the gate structure 203. The recesses 208a and 208b can be adjacent to the spacers 211a and 211b, respectively. In some embodiments, the spacers 211a and 211b can be made of at least one material, such as silicon nitride, silicon oxynitride, silicon carbide, silicon oxycarbide, other spacer materials, and/or any combinations thereof. In other embodiments, the spacers 211a and 211b can be referred to as offset spacers.

Figure 2C:
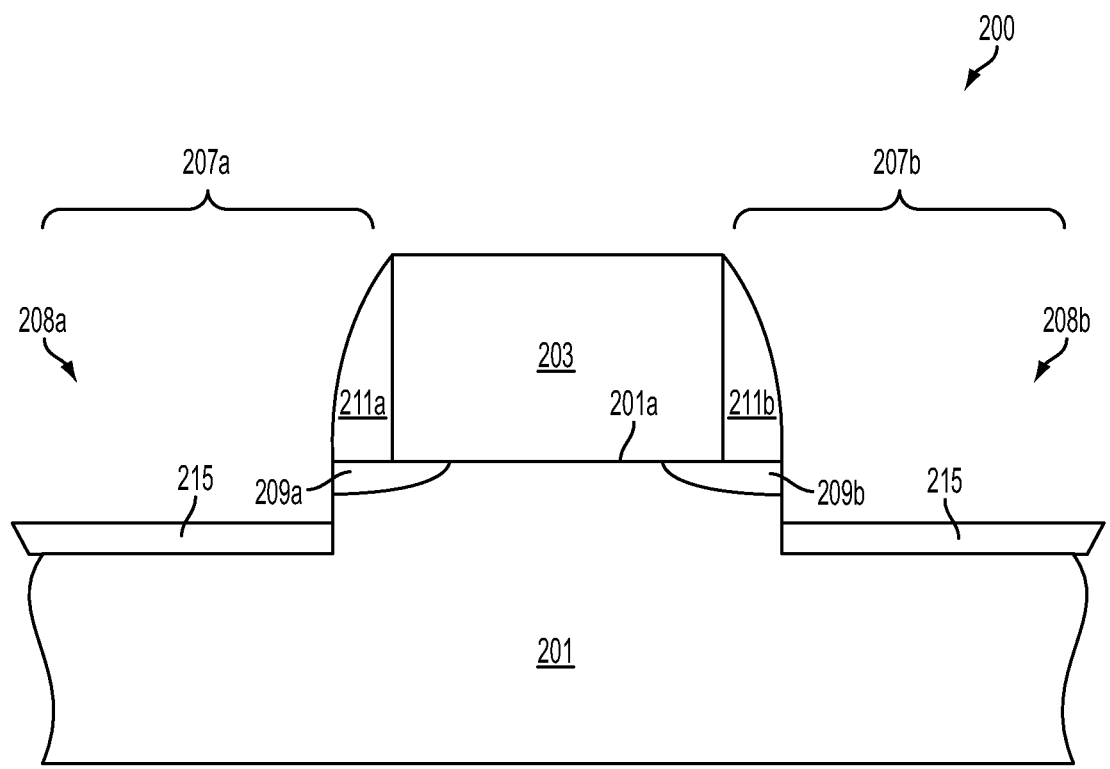

Referring to FIGS. 1 and 2C-2H, the method 100 can include forming a silicon-containing material structure in each of the recesses (block 130). In some embodiments, the block 130 can include performing an epitaxial deposition/partial etch process and repeating the epitaxial deposition/partial etch process at least once. For example, the block 130 can include epitaxially depositing a silicon-containing material, e.g., a silicon-containing material 215, in each of the recesses 208a-208b as shown in FIG. 2C.

In some embodiments forming an N-type transistor, the silicon-containing material 215 can be made of at least one material, such as silicon, silicon carbide, other semiconductor materials, and/or any combinations thereof. The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a P-type transistor, the silicon-containing material 215 can be made of at least one material, such as silicon, silicon germanium, other semiconductor materials, and/or any combinations thereof.

In some embodiments, the silicon-containing layer 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof. In some embodiments, the deposition of the silicon-containing material 215 can have a deposition temperature of about 750° C. or less. In other embodiments, the etching temperature can range from about 500° C. to about 750° C. The pressure of the deposition process can range from about 50 Torr to about 500 Torr.

In some embodiments, the deposition of the silicon-containing material 215 can include in-situ doping the silicon-containing material 215. For example, forming an N-type transistor can use an N-type doping precursor, e.g., phosphine ($PH_3$) and/or other N-type doping precursor. In some embodiments, the N-type doping precursor can have a flow rate ranging from about 20 sccm to about 500 sccm. By using the in-situ doping process, the dopant profile of the silicon-containing material 215 can be desirably achieved. In some embodiments, the silicon-containing material 215 can be an N-type doped silicon layer that is doped with phosphorus. The phosphorus-doped silicon layer can be referred to as a silicon phosphorus (SiP) layer.

Figure 2D:
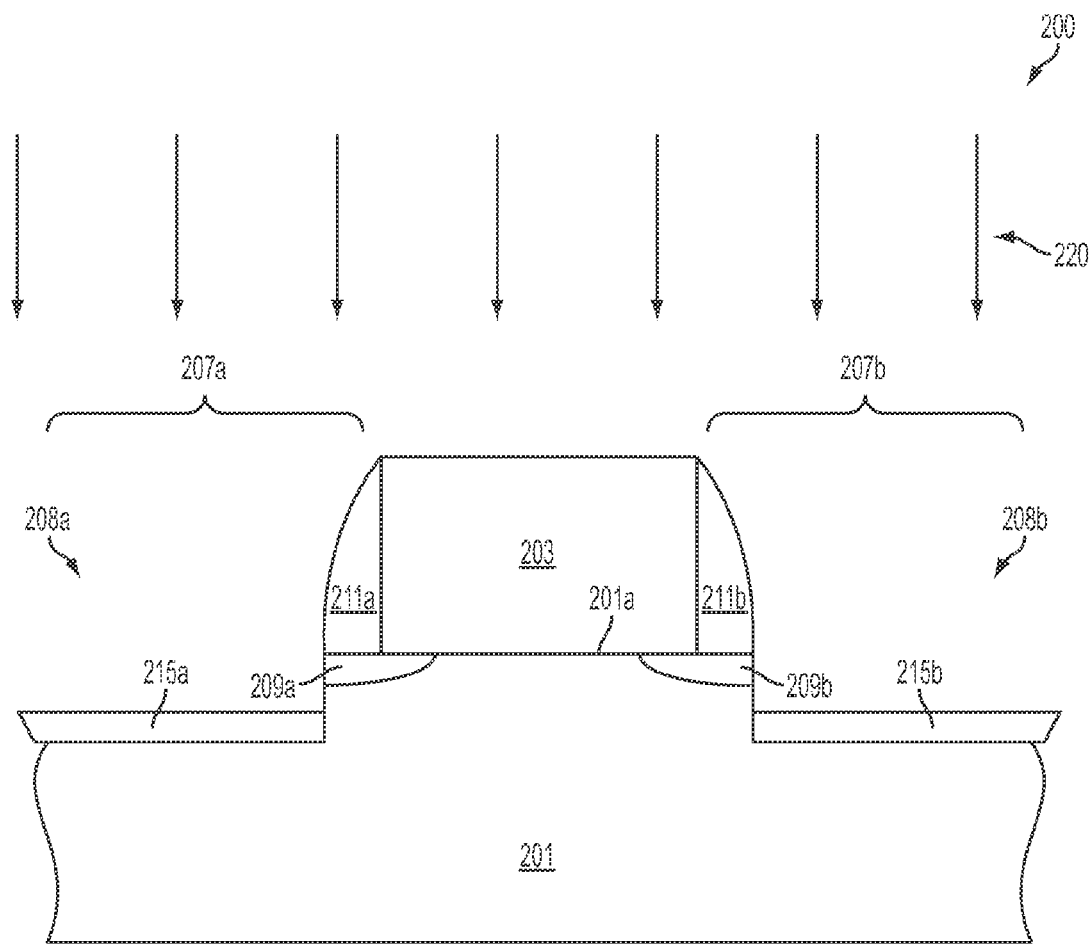

Referring to FIG. 2D, a process 220 can remove a portion of the silicon-containing material 215 in each of the recesses 208a-208b. The remaining silicon-containing material 215a can be formed in each of the recesses 208a-208b. In some embodiments, the process 220 can use an etching gas including at least one of hydrogen chloride (HCl), chlorine (Cl$_2$), germanium hydride (GeH$_4$), other suitable etching gases, and/or any combinations thereof. The flow rate of the etching gas can range from about 30 sccm to about 300 sccm. The pressure of the process 220 can range from about 50 Torr to about 500 Torr. In some embodiments, the process 220 can have an etching temperature of about 750° C. or less. In other embodiments, the etching temperature can range from about 500° C. to about 750° C.

Figure 2E:
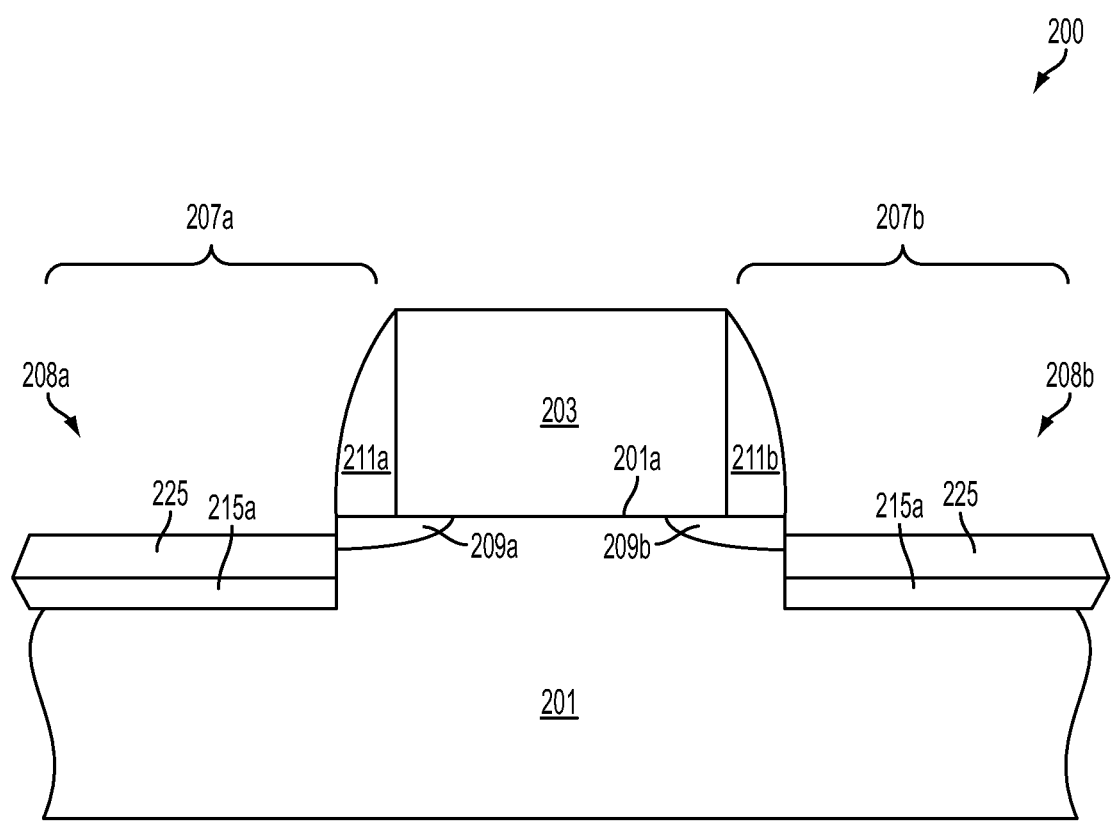

Referring to FIGS. 1 and 2E, the block 130 can include another deposition process. For example, a silicon-containing material 225 can be epitaxially deposited on the remaining silicon-containing material 215a as shown in FIG. 2E. In some embodiments, the material and/or method of forming the silicon-containing material 225 can be as same as or similar to those of the silicon-containing material 215 as described above in conjunction with FIG. 2C. In other embodiments, the silicon-containing material 225 may have a dopant concentration different from that of the silicon-containing material 215.

Figure 2F:
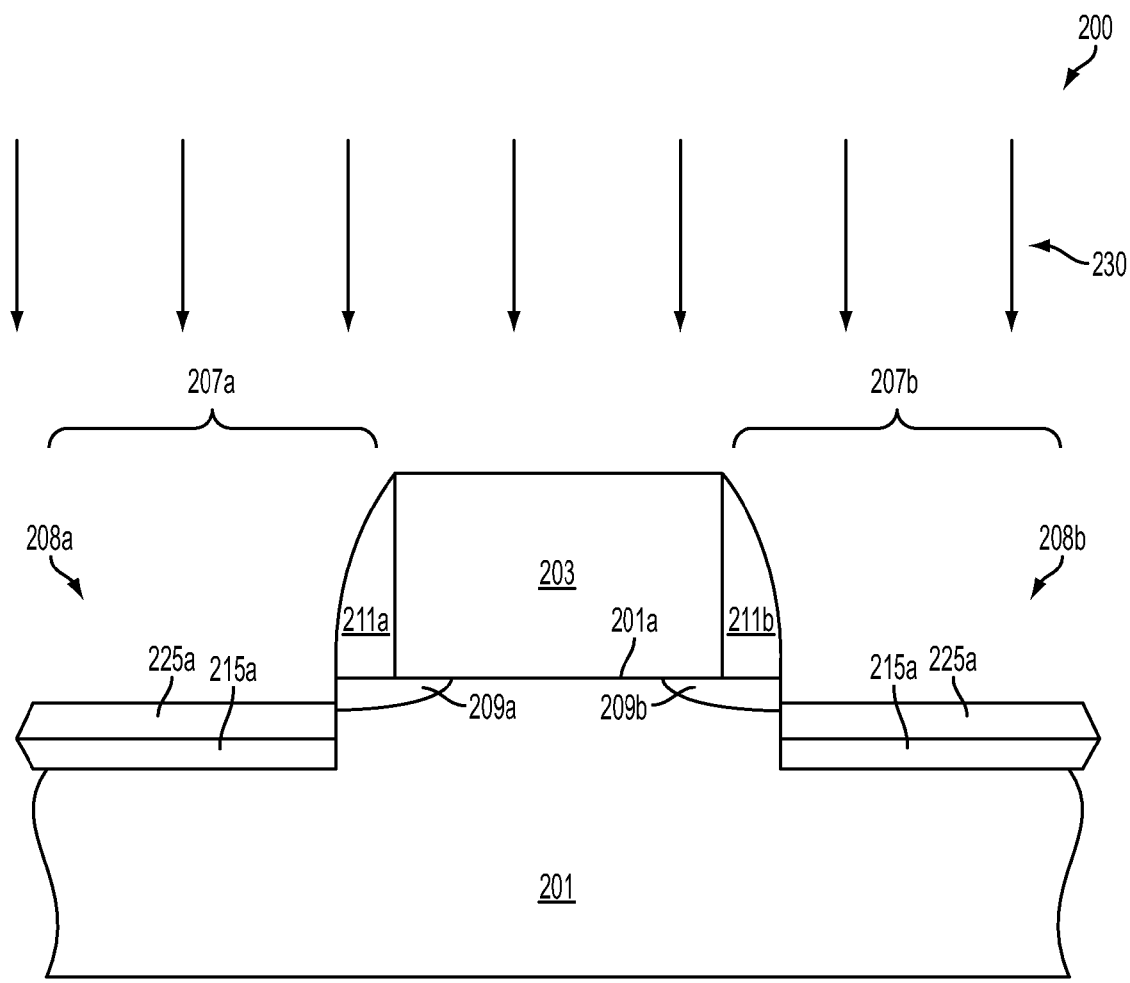

Referring to FIGS. 1 and 2F, the block 130 can include another etching process. For example, a process 230 can remove a portion of the silicon-containing material 225 in each of the recesses 208a-208b. The remaining silicon-containing material 225a can be formed on the remaining silicon-containing material 215a. In some embodiments, the process 230 can be as same as or similar to the process 220 described above in conjunction with FIG. 2D.

Figure 2G:
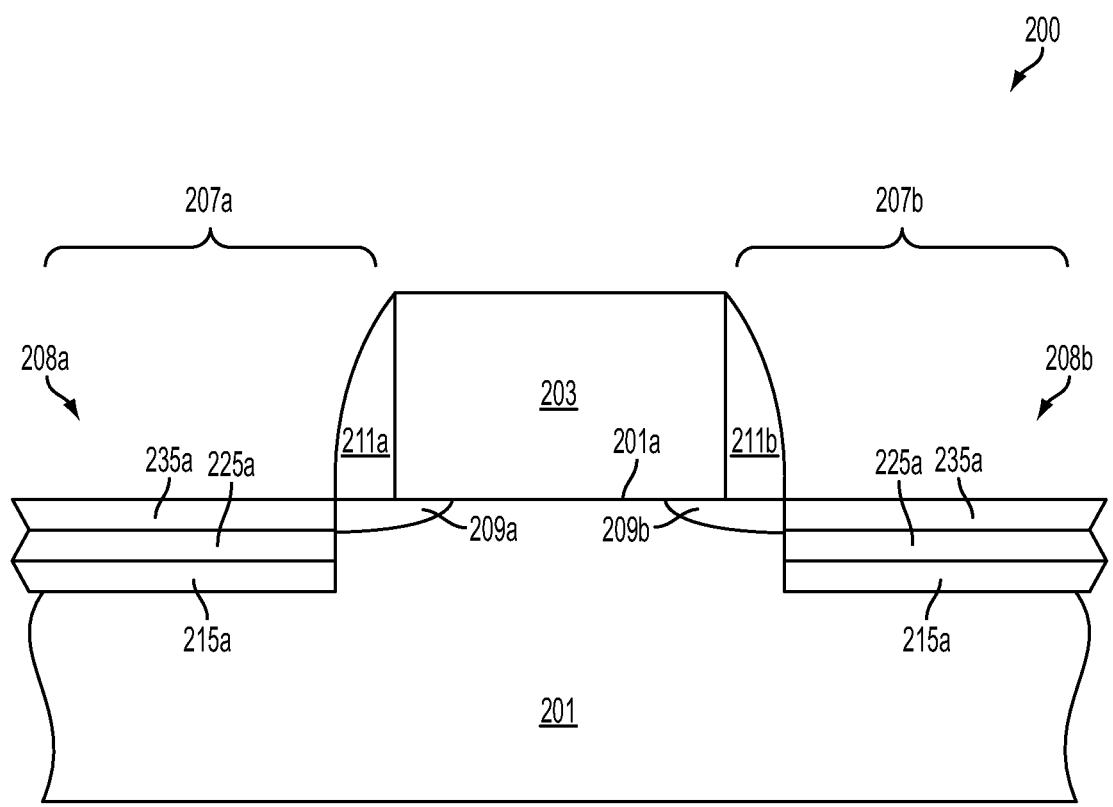

Referring to FIGS. 1 and 2G, in some embodiments the block 130 can further include forming a silicon-containing material 235a on the remaining silicon-containing material 225a. The process of forming of the silicon-containing material 235a can be as same as or similar to the process of forming the remaining silicon-containing material 215a or 225a described above in conjunction with FIGS. 2C-2D and 2E-2F, respectively.

Figure 2H:
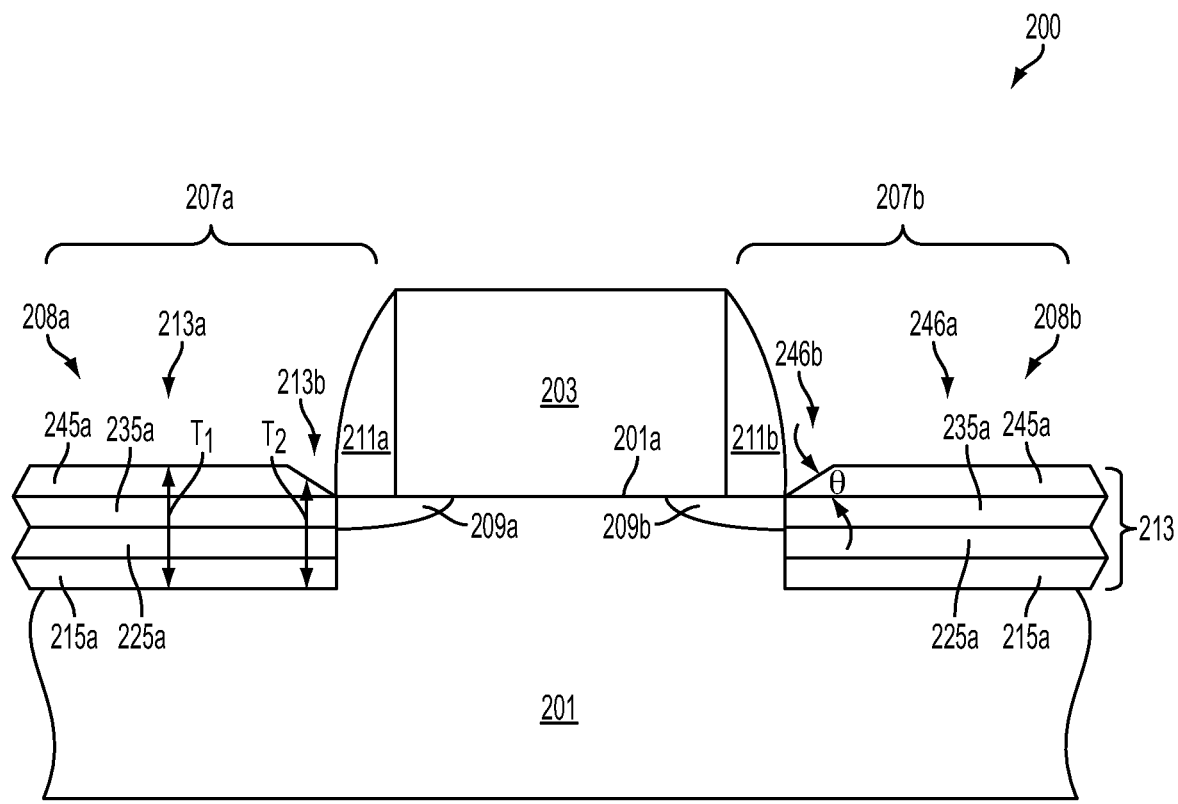

Referring to FIGS. 1 and 2H, in some embodiments the block 130 can further include forming a silicon-containing material 245a on the silicon-containing material 235a. The process of forming of the silicon-containing material 245a can be as same as or similar to the process of forming the remaining silicon-containing material 215a or 225a described above in conjunction with FIGS. 2C-2D and 2E-2F, respectively.

In some embodiments, the silicon-containing material 245a can have a central portion 246a and an edge portion 246b. The edge portion 246b is closer to the gate structure 203 and the spacer 211b than the central portion 246a. Due to the substantial material difference between the silicon-containing material 245a and the spacer 221b, the epitaxial growth of the edge portion 246b may be clamped and slower than that of the central portion 246a. In some embodiments, the edge portion 246b can extend from the spacer 211b to the central portion 246a.

In some embodiments, the silicon-containing materials 215a-245a can be referred to as a silicon-containing material structure 213. The silicon-containing material structure 213 can have regions 213a and 213b. The region 213b can be closer to the gate structure 203 and the spacer 211a than the region 213a. In some embodiments, the region 213b can have an angle θ with respect to the surface 201a of the substrate 201. The angle θ can range from about 30° to about 80°. In other embodiments, the regions 213a and 213b can have thicknesses T$_1$ and T$_2$, respectively. The thickness T$_1$ is larger than the thickness T$_2$. In some embodiments, a top surface of the region 213a can be substantially planar. In other embodiments, the top surface of the region 213a can be arched or rounded.

It is found that, by repeating the epitaxial deposition-etching process as described above, the thickness variation of the silicon-containing material structures 213 formed in a central region and a periphery region of a chip can be reduced. For example, the silicon-containing material structures can be formed in a core region and an I/O region of a chip. The thickness variation of the silicon-containing material structures 213 formed in the core region and the I/O region can be about 2 nm or less. By reducing the thickness variation of the silicon-containing material structures 213, substantial uniform electrical characteristics, e.g., resistances, on currents, off currents, and/or other electrical characteristics, of transistors can be achieved.

It is noted that since the deposition temperature and etching temperature are about 750° C. or less, the N-type dopants or P-type dopants in the silicon-containing material 215a-245a are subjected to low temperature thermal cycles. The dopants are less diffused by the thermal cycles. The dopant profile of the silicon-containing material structure 213 can be desirably achieved.

It is also noted that the silicon-containing material structure 213 shown in FIG. 2H is merely exemplary. In some embodiments, interfaces between the silicon-containing materials 215a-245a may not exist due to the nature of epitaxial deposition. In other embodiments, the interface between the silicon-containing materials 235a-245a may be substantially level with the surface 201a of the substrate 201. In still other embodiments, the interface between the silicon-containing materials 235a-245a may be higher or lower than the surface 201a of the substrate 201.

As noted, the processes of the method 100 described above in conjunction with FIGS. 1 and 2A-2H are merely exemplary. The method 100 can include different steps according to different process flows. For example, the gate structure 203 can be formed by a gate-first process or a gate-last process. In some embodiments using a gate-last process, the method 100 can include a gate replacing process.

The gate structure 203 can be a dummy gate structure. The dummy gate structure 203 can each include a dummy gate material and a hard mask material formed thereover. The dummy gate material can be made of at least one material such as polysilicon, amorphous silicon, silicon oxide, silicon nitride, a material having an etching rate that is substantially different from the spacers (shown in FIG. 2B).

For the gate-last process, the hard mask materials and the dummy gate materials can be removed, for example, by a wet etch process, a dry etch process, or any combinations thereof. After removing the dummy gate materials, the method 100 can include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

In some embodiments, at least one high dielectric constant (high-k) layer (not shown) can be formed under the gate electrode material. The high-k dielectric layer can include high-k dielectric materials such as HfO$_2$, HfSiO, HfSiON, HfTaO, HfTiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride, tantalum, tantalum nitride, other suitable material, and/or combinations thereof.

In some embodiments, the metallic work function layer can include at least one P-metal work function layer and/or at least one N-metal work function layer. The P-type work function materials can include compositions such as ruthenium, palladium, platinum, cobalt, nickel, and conductive metal oxides, and/or other suitable materials. The N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the metallic conductive layer can be made of at least one material, such as aluminum, copper, Ti, TiN, TaN, Ta, TaC, TaSiN, W, WN, MoN, MoON, RuO$_2$, and/or other suitable materials.

In some embodiments, dielectric materials, contact plugs, via plugs, metallic regions, and/or metallic lines (not shown) can be formed over the gate electrode portions for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

In a first exemplary embodiment, a method of forming an integrated circuit includes forming a gate structure over a substrate. Portions of the substrate are removed to form recesses adjacent to the gate structure. A silicon-containing material structure is formed in each of the recesses. The silicon-containing material structure has a first region and a second region, the second region is closer to the gate structure than the first region, and the first region is thicker than the second region.

In a second exemplary embodiment, a method of forming an integrated circuit includes forming a gate structure over a substrate. Portions of the substrate are removed to form recesses adjacent to the gate structure. A first silicon-containing material is epitaxially deposited in each of the recesses. A portion of the first silicon-containing material is removed in each of the recesses.

In a third exemplary embodiment, an integrated circuit includes a gate structure disposed over a substrate. A silicon-containing material structure is disposed in each of recesses that are adjacent to the gate structure. The silicon-containing material structure has a first region and a second region, the second region is closer to the gate structure than the first region, and the first region is thicker than the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a gate structure over a substrate;
    removing portions of the substrate to form recesses adjacent to the gate structure; and
    forming a silicon-containing material structure in each of the recesses, wherein the silicon-containing material structure includes at least one first layer and a second layer, wherein the first layer and the second layer are a same material, an edge of the first layer closest to the gate structure is aligned with an edge of the second layer closest to the gate structure, the second layer has a first region and a second region, the second region is closer to the gate structure than the first region, and the first region is formed faster than the second region and therefore is thicker than the second region and the at least one first layer has a substantially constant thickness, and the second region extends above a top surface of the substrate.

2. The method of claim 1, wherein the second region has an angle with respect to the surface of the substrate ranging from about 30° to about 80°.

3. The method of claim 1, wherein a top surface of the first region is substantially planar.

4. The method of claim 1, further comprising:
    forming a spacer on each sidewall of the gate structure, wherein the second region is adjacent to the spacer.

5. The method of claim 1, wherein forming the silicon-containing structure comprises:
    epitaxially depositing a silicon-containing material in each of the recesses;
    removing a portion of the silicon-containing material in each of the recesses; and
    repeating the epitaxial deposition and the removing process of the silicon-containing material.

6. The method of claim 5, wherein the epitaxial deposition has a deposition temperature of about 750° C. or lower.

7. The method of claim 5, wherein the epitaxial deposition has a deposition temperature ranging from about 500° C. to about 750° C.

8. The method of claim 5, wherein the epitaxial deposition comprises:
    in-situ doping the silicon-containing material with an N-type dopant.

9. A method of forming an integrated circuit, the method comprising:
    forming a gate structure over a substrate;
    removing portions of the substrate to form recesses adjacent to the gate structure;
    epitaxially depositing at least one first silicon-containing material in each of the recesses; and
    removing a portion of the at least one first silicon-containing material in each of the recesses, the at least one first silicon-containing material having a substantially constant thickness; and
    epitaxially depositing a second silicon-containing material on the at least one first silicon-containing material, wherein an edge of the first silicon-containing material closest to the gate structure is aligned with an edge of the second silicon-containing material closest to the gate structure, the second silicon-containing material having a first region and a second region closer to the gate structure than the first region, a growth rate and therefore thickness of the first region are greater than a growth rate and thickness of the second region.

10. The method of claim 9, wherein the gate structure is a dummy gate structure.

11. The method of claim 9, wherein removing portions of the substrate comprises removing lightly doped drain (LDD) portions of the substrate.

12. The method of claim 9, wherein the second region has an angle with respect to a surface of the substrate ranging from about 30° to about 80°.

13. The method of claim 9, wherein a top surface of the first region is substantially planar.

14. The method of claim 9, wherein epitaxially depositing the at least one first and second silicon-containing material each have a deposition temperature of about 750° C. or lower.

15. The method of claim 9, wherein epitaxially depositing the at least one first and second silicon-containing material each have a deposition temperature ranging from about 500° C. to about 750° C.

16. The method of claim 9, wherein epitaxially depositing the at least one first silicon-containing material comprises:
   in-situ doping the first silicon-containing material with an N-type dopant.

17. A method of forming an integrated circuit, the method comprising:
   forming a gate structure over a substrate;
   removing portions of the substrate to form recesses adjacent to the gate structure;
   forming at least one first silicon-containing layer in each of the recesses, the at least one first silicon-containing layer having a substantially constant thickness; and
   forming a second silicon-containing layer in each of the recesses, wherein the first silicon-containing layer and the second silicon-containing layer are a same material, an edge of the first silicon-containing layer closest to the gate structure is aligned with an edge of the second silicon-containing layer closest to the gate structure, wherein the second silicon-containing layer has a first region and a second region, the second region is closer to the gate structure than the first region, and the first region is formed faster than the second region and therefore is thicker than the second region, and the second region extends above a top surface of the substrate.

18. The method of claim 17, wherein the second region has an angle with respect to a surface of the at least one first silicon-containing layer ranging from about 30° to about 80°.

19. The method of claim 17, wherein forming the at least one first silicon-containing layer comprises:
   epitaxially depositing at least one first silicon-containing material in each of the recesses; and
   removing a portion of the at least one first silicon-containing material in each of the recesses.

20. The method of claim 17, wherein forming the at least one first silicon-containing layer comprises forming two or more first silicon-containing layers.

\* \* \* \* \*